United States Patent
Vick et al.

(10) Patent No.: US 10,418,344 B2
(45) Date of Patent: Sep. 17, 2019

(54) ELECTRONIC PACKAGES WITH THREE-DIMENSIONAL CONDUCTIVE PLANES, AND METHODS FOR FABRICATION

(71) Applicant: Micross Advanced Interconnect Technology LLC, Research Triangle Park, NC (US)

(72) Inventors: Erik Paul Vick, Raleigh, NC (US); Dorota Temple, Cary, NC (US)

(73) Assignee: Micross Advanced Interconnect Technology LLC, Research Triangle Park, NC (US)

(*) Notice: Subject to any disclaimer, the term of this patent is extended or adjusted under 35 U.S.C. 154(b) by 0 days.

(21) Appl. No.: 15/881,238

(22) Filed: Jan. 26, 2018

(65) Prior Publication Data
US 2018/0151542 A1    May 31, 2018

Related U.S. Application Data

(63) Continuation of application No. 15/304,858, filed as application No. PCT/US2015/026682 on Apr. 20, 2015, now Pat. No. 9,881,905.
(Continued)

(51) Int. Cl.
*H01L 25/065* (2006.01)
*H01L 23/00* (2006.01)
(Continued)

(52) U.S. Cl.
CPC ........ *H01L 25/0657* (2013.01); *H01L 23/481* (2013.01); *H01L 24/24* (2013.01); *H01L 24/82* (2013.01); *H01L 24/92* (2013.01); *H01L 25/50* (2013.01); *H01L 23/49822* (2013.01); *H01L 23/49827* (2013.01); *H01L 24/25* (2013.01); *H01L 24/29* (2013.01); *H01L 24/83* (2013.01);
(Continued)

(58) Field of Classification Search
CPC ......... H01L 25/0657; H01L 2224/8385; H01L 2225/06544
See application file for complete search history.

(56) References Cited

U.S. PATENT DOCUMENTS

| | | |
|---|---|---|
| 7,271,491 B1 | 9/2007 | Akram |
| 8,361,901 B2 | 1/2013 | Vick et al. |

(Continued)

FOREIGN PATENT DOCUMENTS

| | | |
|---|---|---|
| JP | 20090146940 A | 7/2009 |
| JP | 2010098064 A | 4/2010 |
| WO | 2014004504 A1 | 1/2014 |

OTHER PUBLICATIONS

International Search Report and Written Opinion issued in counterpart International Application No. PCT/US2015/026682 dated Jul. 8, 2015 (nine (9) pages).
(Continued)

*Primary Examiner* — Sonya D. McCall-Shepard
(74) *Attorney, Agent, or Firm* — Olive Law Group, PLLC

(57) ABSTRACT

An electronic package includes an adhesion layer between a first substrate and a second substrate. The adhesion layer is patterned to define openings aligned with through-substrate interconnects and corresponding bond pads. A conductive plane is formed between the first substrate and the second substrate, adjacent to the adhesion layer.

20 Claims, 7 Drawing Sheets

Related U.S. Application Data

(60) Provisional application No. 61/982,153, filed on Apr. 21, 2014.

(51) Int. Cl.
  *H01L 25/00* (2006.01)
  *H01L 23/48* (2006.01)
  *H01L 23/498* (2006.01)

(52) U.S. Cl.
  CPC .. *H01L 2224/244* (2013.01); *H01L 2224/245* (2013.01); *H01L 2224/24051* (2013.01); *H01L 2224/24105* (2013.01); *H01L 2224/24146* (2013.01); *H01L 2224/2511* (2013.01); *H01L 2224/32145* (2013.01); *H01L 2224/8385* (2013.01); *H01L 2224/83191* (2013.01); *H01L 2224/83203* (2013.01); *H01L 2224/92144* (2013.01); *H01L 2224/94* (2013.01); *H01L 2225/06513* (2013.01); *H01L 2225/06524* (2013.01); *H01L 2225/06527* (2013.01); *H01L 2225/06531* (2013.01); *H01L 2225/06541* (2013.01); *H01L 2225/06544* (2013.01); *H01L 2225/06565* (2013.01)

(56) References Cited

U.S. PATENT DOCUMENTS

| | | |
|---|---|---|
| 2001/0005059 A1 | 6/2001 | Koyanagi et al. |
| 2004/0219706 A1 | 11/2004 | Wan |
| 2006/0278991 A1 | 12/2006 | Kwon et al. |
| 2009/0294974 A1 | 12/2009 | Leung et al. |
| 2010/0270685 A1 | 10/2010 | Vick et al. |
| 2012/0193785 A1* | 8/2012 | Lin .................. H01L 21/76229 257/737 |
| 2015/0131204 A1 | 5/2015 | Cho et al. |

OTHER PUBLICATIONS

International Preliminary Report on Patentability issued in counterpart International Application No. PCT/US2015/026682 dated Oct. 25, 2016 (seven (7) pages).

* cited by examiner

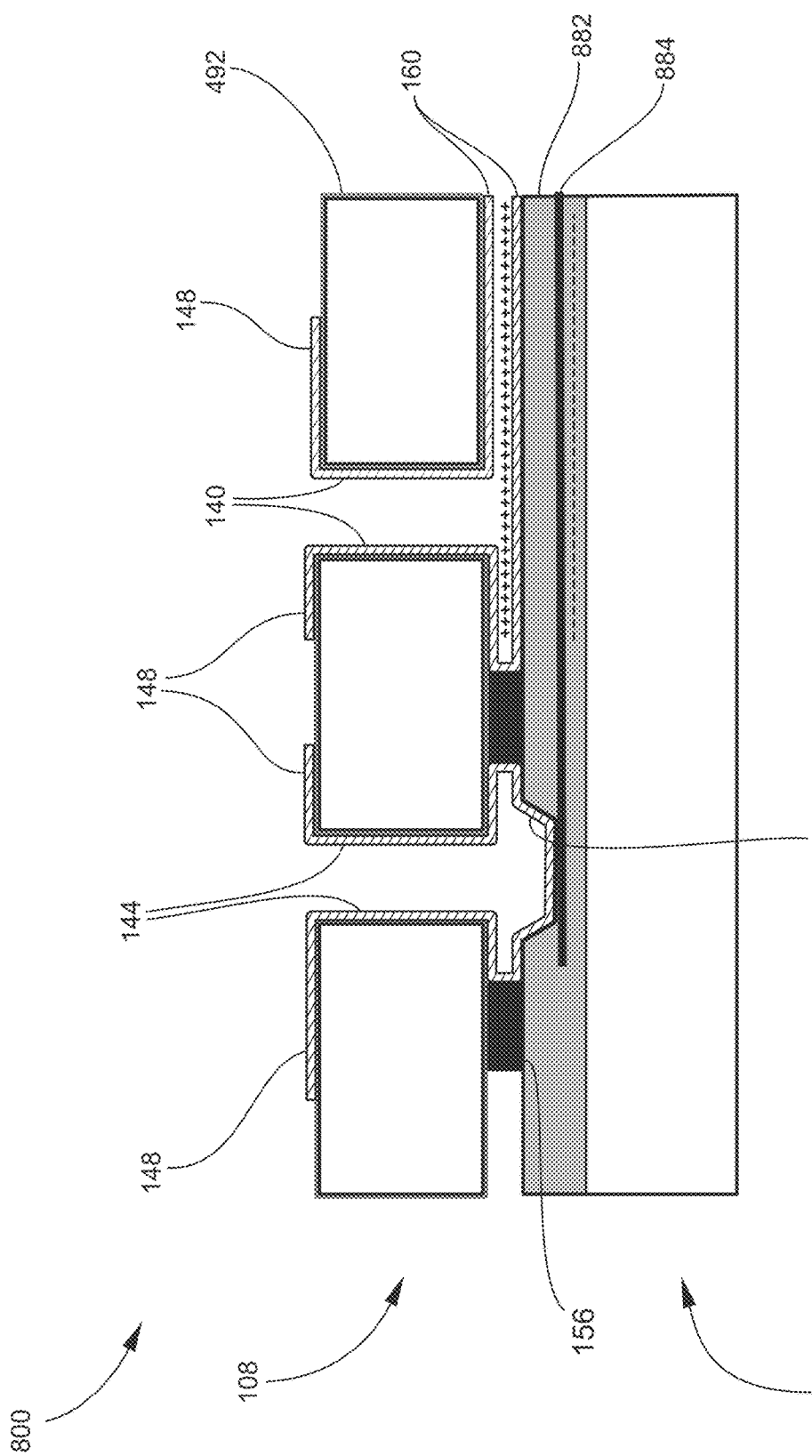

ELECTRONIC PACKAGES WITH THREE-DIMENSIONAL CONDUCTIVE PLANES, AND METHODS FOR FABRICATION

CROSS REFERENCE TO RELATED APPLICATIONS

This application is a continuation of U.S. patent application Ser. No. 15/304,858, filed on Oct. 17, 2016, and titled ELECTRONIC PACKAGES WITH THREE DIMENSIONAL CONDUCTIVE PLANES, AND METHODS FOR FABRICATION, which claims priority to PCT International Patent Application No. PCT/US2015/026682, filed Apr. 20, 2015, and titled ELECTRONIC PACKAGES WITH THREE-DIMENSIONAL CONDUCTIVE PLANES, AND METHODS FOR FABRICATION, which claims the benefit of U.S. Provisional Patent Application Ser. No. 61/982,153, filed Apr. 21, 2014, titled "ELECTRONIC PACKAGES WITH THREE-DIMENSIONAL CONDUCTIVE PLANES, AND METHODS FOR FABRICATION," the disclosures of which are incorporated by reference herein in their entireties.

TECHNICAL FIELD

The present invention relates generally to electronics fabrication and packaging in which two or more substrates are bonded together in a three-dimensional (3D) or stacked format, and 3D or vertical interconnects are utilized for signal communication between bonded substrates or devices associated with the substrates. In one specific aspect, the invention relates to 3D electronic packages that integrate conductive planes for use as ground planes, power planes, signal planes, or as part of capacitors or inductors.

BACKGROUND

Conventional microelectronic devices are packaged in a planar or two-dimensional (2D) surface-mount configuration. In this configuration, the package size (particularly the footprint) is dictated by both the number of and physical dimensions of the integrated circuit (IC) chips or other discrete devices included in the package, as well as the area occupied by the discrete surface-mounted passive components utilized. There is a continuing demand for smaller electronic products that at the same time provide a higher level of functionality. Hence, there is a concomitant demand for higher-performance, smaller-footprint packaged microelectronic devices for use in such products. In response, researchers continue to develop three-dimensional (3D) integration or chip-stacking technologies as an alternative to the conventional 2D format. By implementing 3D integration, multiple die may be "vertically" arranged (in the third dimension) in a single packaged electronic device, with adjacent die communicating by way of 3D (or "vertical") metal interconnects extending through the thicknesses of the die substrates. Also, 3D integration can enable vertical integration of passives such as capacitors and inductors, thereby reducing overall package size. 3D integration may be done at the wafer level (wafer-to-wafer bonding), the die level (die-to-die bonding), or in a hybrid format (die-to-wafer bonding). 3D packages can provide various advantages, such as shorter signal propagation delay (and thus faster signal processing), lower power consumption, reduced cross-talk, smaller package footprint, smaller device size, and higher input/output (I/O) count and density. Moreover, the different die stacked in the 3D package may be configured to provide different functions. For example, one die may include an active electronic device while another die may include an arrangement of passive components (resistors, capacitors, inductors, etc.), an array of memory modules, or a ground plane that communicates with several interconnects.

The formation of 3D metal interconnects has generally been accomplished by either a "vias first" approach or a "vias last" approach. In the "vias first" approach, the interconnects are formed prior to circuitry fabrication, substrate thinning, and substrate (die or wafer) bonding. In the "vias last" approach, the interconnects are formed after circuitry fabrication, substrate thinning, and substrate bonding. Particularly in the case of the "vias last" approach, the interconnect metal may need to be deposited through more than one layer of material in order for the metal to land on the surface of a contact pad and form a low-resistance electrical coupling with the contact pad. For example, to reach the contact pad the interconnect metal may need to be deposited through a deep via that extends through the entire thickness of one substrate and possibly partially into the thickness of an adjacent substrate where the contact pad is located, as well as through one or more intervening layers between these two substrates such as bonding layers, insulating layers, passivation layers, etc. Moreover, as a result of preceding material addition steps, an etching step (i.e., "bottom-clear" etching) such as deep reactive ion etching (DRIE) is typically required to expose the contact pad prior to the interconnect metallization step. Effective etching and interconnect metallization steps become more challenging as the aspect ratio (i.e., depth-to-diameter) of the vias increases.

In U.S. Pat. No. 8,361,901, titled DIE BONDING UTILIZING PATTERNED ADHESION LAYER; and co-pending International Publication No. WO 2014/004504, titled THREE-DIMENSIONAL ELECTRONIC PACKAGES UTILIZING UNPATTERNED ADHESIVE LAYER; the contents of both of which are incorporated by reference herein in their entireties, these difficulties are addressed by utilizing an adhesive layer as the bonding medium between two substrates. This adhesive layer is deposited on one substrate and patterned to create openings exposing underlying contact pads of the substrate. The two substrates are then bonded together, with the metal pads of the one substrate being aligned with corresponding vias of the other substrate. This approach facilitates the subsequent bottom-clear and interconnect metallization steps.

It would be further desirable to integrate large-area 3D conductive planes in 3D electronic packages. Such conductive planes may be useful, for example, as ground planes, power planes, signal planes, inductor coils or as capacitor electrodes. It would be desirable to integrate such functionality within the footprint and thickness of 3D electronic packages. Currently, wafer-scale conductive planes are difficult to produce due to defect levels, as even one particle could short the plane to an adjacent layer/level. It would thus be desirable to provide methods for fabricating integrated conductive planes that reduce the occurrence of particles and/or are tolerant to particles. More generally, it would be desirable to provide 3D electronic packages featuring integrated conductive planes that perform reliably and effectively, and methods for fabricating such electronic packages.

SUMMARY

To address the foregoing problems, in whole or in part, and/or other problems that may have been observed by persons skilled in the art, the present disclosure provides methods, processes, systems, apparatus, instruments, and/or devices, as described by way of example in implementations set forth below.

According to one embodiment, an electronic package includes: a first substrate; a plurality of electrically conductive contact pads disposed on the first substrate; a second substrate comprising a plurality of through-substrate first vias and a plurality of through-substrate second vias; an electrically insulating adhesion layer disposed between and bonding together the first substrate and the second substrate, the adhesion layer having a thickness between the first substrate and the second substrate, and comprising a plurality of openings through the thickness, and an adhesion layer edge defining a conductive plane space between the first substrate and the second substrate; an electrically conductive plane extending through the conductive plane space and into contact with the adhesion layer edge; a plurality of electrically conductive first interconnects extending through respective first vias and into contact with the conductive plane; a plurality of electrically conductive second interconnects extending through respective second vias, through openings aligned with the respective second vias, and into contact with contact pads aligned with the respective second vias, wherein the second interconnects are electrically isolated from the electrically conductive plane.

According to another embodiment, a method for fabricating an electronic package includes: forming an electrically insulating adhesion layer on a first substrate; patterning the adhesion layer to form a plurality of openings through the adhesion layer and an adhesion layer edge, wherein the openings expose a plurality of electrically conductive contact pads disposed on the first substrate, and the adhesion layer edge defines a conductive plane space on the first substrate in which material of the adhesion layer is absent; aligning a second substrate with the first substrate such that first vias of the second substrate are aligned with the conductive plane space and second vias of the second substrate are aligned with the respective openings; bonding the first substrate and the second substrate together by bringing the second substrate into contact with the adhesion layer and applying a force to at least one of the first substrate and the second substrate while heating the adhesion layer, wherein the conductive plane space is between the first substrate and the second substrate and adjacent to the adhesion layer; and performing a metallization process to form an electrically conductive plane, a plurality of first interconnects, and a plurality of second interconnects, wherein the conductive plane extends through the conductive plane space into contact with the adhesion layer edge, the first interconnects extend through respective first vias into contact with the conductive plane, and the second interconnects extend through the respective second vias and openings and into contact with respective contact pads aligned with the second vias, and wherein the second interconnects are electrically isolated from the electrically conductive plane.

According to another embodiment, an electronic package is provided, which is fabricated according to any of the methods disclosed herein.

Other devices, apparatus, systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE DRAWINGS

The invention can be better understood by referring to the following figures. The components in the figures are not necessarily to scale, emphasis instead being placed upon illustrating the principles of the invention. In the figures, like reference numerals designate corresponding parts throughout the different views.

FIG. 8 is a schematic elevation view of an example of an electronic package (or part of the electronic package) according to another embodiment.

DETAILED DESCRIPTION

Figure 1:
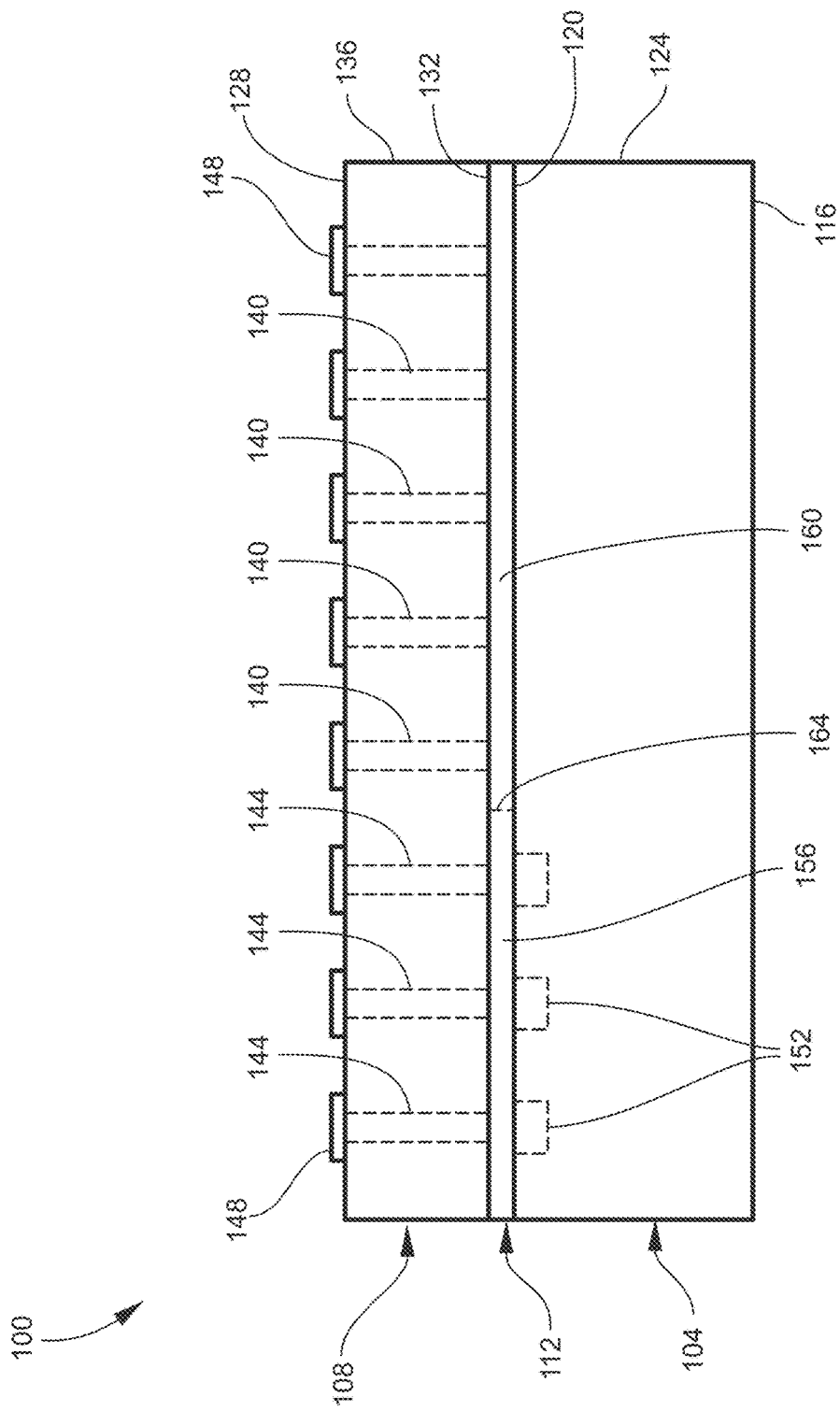
FIG. 1 is a schematic elevation view of an example of an electronic package (or part of the electronic package) according to some embodiments.

FIG. 1 is a schematic elevation view of an example of an electronic package 100 (or part of the electronic package 100) according to some embodiments. The electronic package 100 may generally include a first substrate 104, a second substrate 108, and an intermediate region or layer(s) 112 between the first substrate 104 and the second substrate 108. For reference purposes, the first substrate 104, intermediate region or layer(s) 112, and second substrate 108 may be considered as being stacked in a vertical direction (or "thickness" direction). From this perspective, the first substrate 104 may be referred to as a lower substrate, and the second substrate 108 may be referred to as an upper substrate. The horizontal direction may be referred to as the transverse direction or plane. Thus, the first substrate 104, intermediate region or layer(s) 112, and second substrate 108 each have a thickness in the vertical direction and a cross-sectional area in a transverse plane (i.e., into and perpendicular to the drawing sheet). It will be understood, however, that the orientation of the electronic package 100 depicted in FIG. 1 is by example only. As such, terms such as vertical, horizontal, upper, lower, and the like are merely relative terms.

The first substrate 104 and/or the second substrate 108 may be a wafer from which multiple die are singulated before or after bonding. Alternatively, the first substrate 104 and/or the second substrate 108 may be a die singulated from a wafer. Accordingly, the methods disclosed herein may entail wafer-to-wafer bonding, die-to-wafer bonding, or die-to-die bonding. In typical embodiments, at least one of the substrates 104 and 108 includes a semiconductor material such as, for example, silicon, silicon-germanium alloy, silicon carbide, a Group III-V compound (e.g., gallium arsenide, gallium nitride, etc.), a Group II-VI compound (e.g., zinc oxide), etc. In some embodiments, one or both of the substrates 104 and 108 may include an electrically insulating or dielectric material such as, for example, a glass, a non-conductive oxide, a non-conductive nitride, a ceramic, etc. In some embodiments, one or both of the substrates 104 and 108 may be, or be fabricated from, a silicon-on-insulator (SOI) substrate. In some embodiments, one or both of the substrates 104 and 108 may include one or more passive electronic components (e.g., resistors, capacitors, interconnects) and/or active electronic components (e.g., transistors), or one or more integrated circuits containing an ordered arrangement of several electronic components. One or both of the substrates 104 and 108 may additionally or alternatively include one or more microfabricated mechanical, electromechanical, optical, or radio frequency (RF) transmitting components. Such components or circuitry may be formed on or into the thickness of the substrate 104 and 108, and may be considered as being part of a device layer that is disposed on a surface of a base layer constituting the bulk substrate material. Thus, depending on the embodiment, one or both of the substrates 104 and 108 may be considered as being a microelectronic device, an optoelectronic device, a micro-electromechanical systems (MEMS) device, etc. Moreover, the two substrates 104 and 108 may be configured to perform different functions. For example, one substrate may be configured as an electronic device that performs logic functions while the other substrate is configured primarily to provide input/output (I/O) signal communication and power supply to the electronic device. In another example, the second substrate 108 is configured as an interposer that routes power and signals between (to and/or from) the first substrate 104 and another device (not shown) positioned on the second substrate 108.

The first substrate 104 and the second substrate 108 each have opposing main surfaces in transverse planes and a thickness between the opposing main surfaces in the vertical direction (again, from the perspective of FIG. 1). The first substrate 104 and the second substrate 108 may each be considered as being generally planar or plate-shaped, in that the sides defining its main surfaces are typically greater than its thickness, and/or the main surfaces have the largest areas of any of the outside surfaces of the substrate 104 and 108. The main surfaces thus define the respective footprints (outer perimeters) of the substrates 104 and 108. Specifically, the first substrate 104 includes an outside main surface 116 facing away from the second substrate 108, an opposing inside main surface 120 facing toward the second substrate 108, and an outer (lateral) surface or edge 124 between the outside main surface 116 and the inside main surface 120 and defining the thickness of the first substrate 104. The second substrate 108 includes an outside main surface 128 facing away from the first substrate 104, an opposing inside main surface 132 facing toward the first substrate 104, and an outer (lateral) surface or edge 136 between the outside main surface 128 and the inside main surface 132 and defining the thickness of the second substrate 108.

By example only, FIG. 1 illustrates the first substrate 104 and the second substrate 108 as having the same size (footprint), with the understanding that they may have different sizes. For example, the first substrate 104 may occupy just a region within the footprint of the second substrate 108. In this case, first substrate 104 may be the only component located on the second substrate 108 at the same elevation level, or more than one first substrate 104 may be located on the second substrate 108, or one or more other types of components may also be located on the second substrate 108 at the same elevation level.

The second substrate 108 includes a plurality of three-dimensional (3D) interconnects (or "vertical" interconnects) extending through respective through-substrate vias (TSVs), i.e., vias formed through the entire thickness of the second substrate 108 from the outside main surface 128 to the inside main surface 132. In some embodiments, the interconnects may be grouped into first interconnects 140 and second interconnects 144, as described below. In some embodiments, the interconnects 140 and 144 may be hollow. That is, each interconnect 140 and 144 may be configured as a layer (or coating, lining, film, etc.) conformally disposed on the inner surface of the second substrate 108 that defines the via. In other embodiments, the interconnects 140 and 144 may be solid, entirely or substantially filling the vias. The interconnects 140 and 144 (and corresponding vias) may be shaped as generally straight cylinders or may be tapered. The interconnects 140 and 144 (and corresponding vias) may run along a single direction (e.g., vertical) through the entire thickness of the second substrate 108, or may include one or more bends. The interconnects 140 and 144 may contact respective contact pads 148 formed on the outside main surface 128. The contact pads 148 may be configured as needed according to the requirements of the device design, such as for making electrical contact with one or more integrated circuit (IC) chips or other electronic devices, or with wiring, conductive traces, etc.

In some embodiments, a conformal layer of electrically insulating material (not shown) may be disposed on the surfaces of the second substrate 108, including the inner surfaces defining the vias, to electrically isolate the second substrate 108 from the interconnects 140 and 144 and the contact pads 148. Examples of compositions of this insulating layer include, but are not limited to, metal oxide (e.g., sapphire), metalloid oxide (e.g., silicon dioxide), metal nitride, metalloid nitride (e.g., silicon nitride), glass, quartz, diamond-like carbon (DLC), and polymers such as photoresist, polyimide (including co-polymers and blends thereof), a polyparaxylylene (i.e., from the family of Parylenes), a liquid crystal polymer (LCP), or benzocyclobutene (BCB).

Generally, the interconnects 140 and 144 may be composed of any suitable electrically conductive material, typical examples of which include, but are not limited to, copper, tungsten, and titanium. The contact pads 148 may likewise be composed of any suitable electrically conductive material. In typical embodiments, the material utilized to form both the interconnects 140 and 144 and the contact pads 148 is deposited on the surfaces of the second substrate 108 (or on an insulating layer covering the surfaces of the second substrate 108) during the same metallization process step, in which case the interconnects 140 and 144 and the contact pads 148 have the same composition.

The first substrate 104 includes a plurality of contact pads 152. The contact pads 152 may be disposed entirely on the outside main surface 120, or at least partially disposed in blind vias formed on the outside main surface 120, or at least partially embedded in the thickness of the first substrate 104. The contact pads 152 may be composed of any suitable electrically conductive material such as, for example, tungsten, tungsten silicide, nickel silicide, aluminum, titanium, titanium-tungsten alloy, copper, aluminum alloy, gold, silver, tin, nickel, or a combination of two or more of the foregoing. At least some of the interconnects 140 and 144 may be aligned with corresponding contact pads 152 in the vertical direction (or "thickness" direction). Such interconnects 140 and 144 may extend through the intermediate region 112 into contact with respective contact pads 152 in a manner described below. In the illustrated embodiment, only second interconnects 144 are shown to be in alignment with respective contact pads 152, although in other embodiments one or more of the first interconnects 140 may also be in alignment with respective contact pads 152.

The intermediate region 112 may include a patterned adhesion layer 156 and an electrically conductive plane 160 (a contiguous layer of electrically conductive material) adjacent to the adhesion layer 156. Both the adhesion layer 156 and the conductive plane 160 are located between the first substrate 104 and the second substrate 108 (between the inside main surfaces 120 and 132).

The adhesion layer 156 may be composed of any electrically insulating material suitable for reliably bonding the first substrate 104 and the second substrate 108 together in conjunction with a bonding technique such as, for example, thermo-compression bonding. Examples of compositions of the adhesion layer 156 include, but are not limited to, photoresists and other types of polymers. The photoresist may be an epoxy-based photoresist such as, for example, SU-8. Other types of polymers include, for example, polyimide (including co-polymers and blends thereof), polyparaxylylene (i.e., from the family of Parylenes), liquid crystal polymer (LCP), and benzocyclobutene (BCB). In some embodiments the adhesion layer 156, and thus the intermediate region 112, has a thickness in a range from 1 to 100 µm. The adhesion layer 156 is patterned so as to include a plurality of adhesion layer openings or holes (not shown in FIG. 1) through the thickness of the adhesion layer 156. The openings are aligned with respective second interconnects 144 and underlying contact pads 152 of the first substrate 104. In addition, the adhesion layer 156 is patterned or formed so as to terminate at an adhesion layer edge 164 that is located within the perimeter (footprint) of the first substrate 104 and the second substrate 108. This adhesion layer edge 164 demarcates the boundary between the adhesion layer 156 and a conductive plane space (or area) between the first substrate 104 and the second substrate 108. The adhesion layer 156 is absent in the conductive plane space. Instead, the conductive plane 160 occupies the conductive plane space.

The conductive plane 160 may be composed of any suitable electrically conductive material. In typical embodiments, the material utilized to form both the interconnects 140 and 144 and the conductive plane 160 is deposited during the same metallization process step, in which case the interconnects 140 and 144 and the conductive plane 160 have the same composition.

Figure 2:
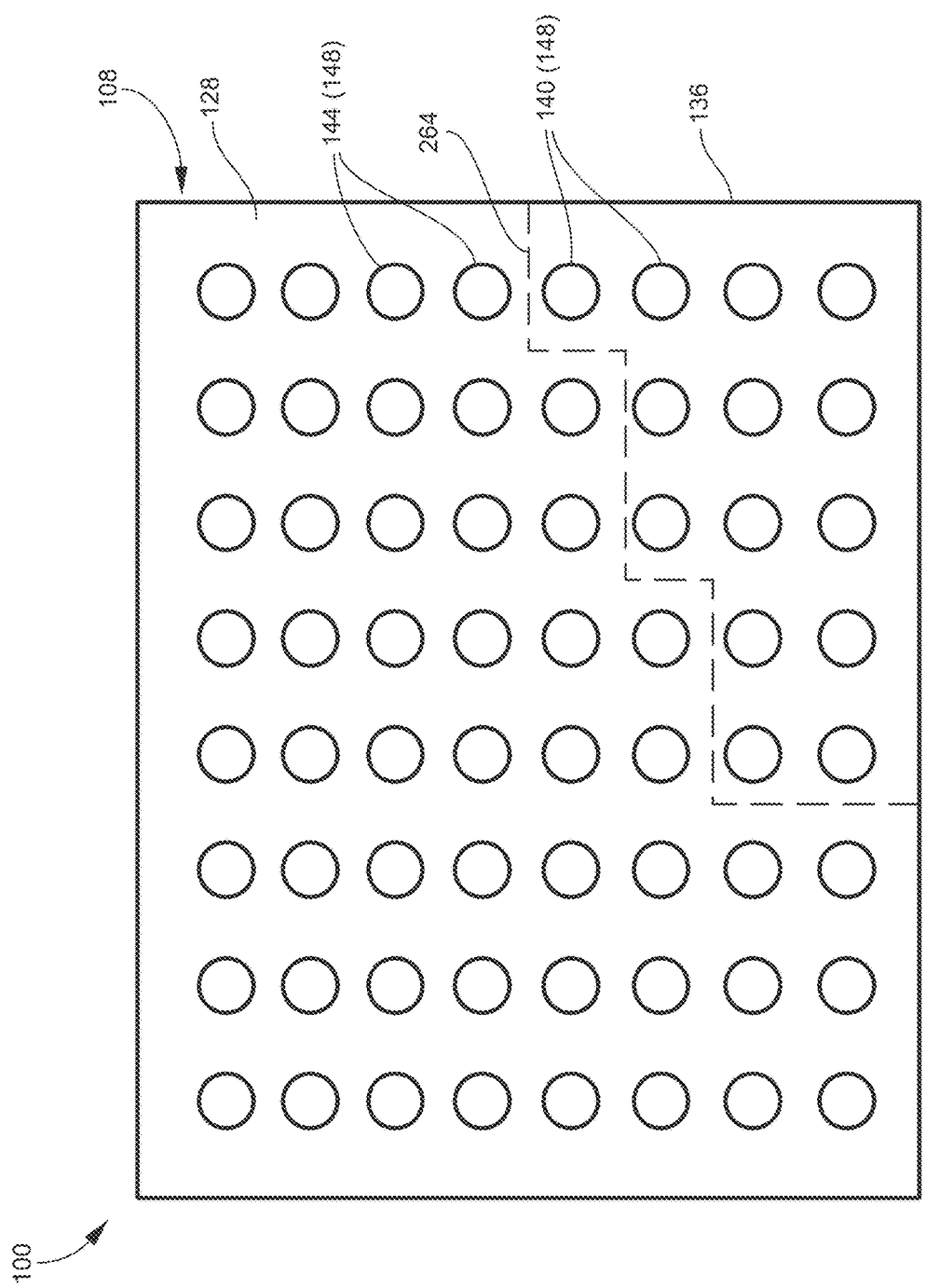
FIG. 2 is a schematic plan view of the electronic package.

FIG. 2 is a schematic plan view of the electronic package 100 (a top plan view, from the perspective of FIG. 1), showing the interconnects 140 and 144 and corresponding contact pads 148 formed on the outside main surface 128 of the second substrate 108. As an example, in FIG. 2 the interconnects 140 and 144 are distributed throughout the entire area of the outside main surface 128 (and throughout the underlying bulk of the second substrate 108). However, it is appreciated by persons skilled in the art that the interconnects 140 and 144 may be distributed over only a section of the outside main surface 128, or different groups of interconnects 140 and 144 may be located in different sections of the outside main surface 128, depending on device design. The interconnects 140 and 144 may be arranged in one or more one-dimensional (linear) and/or two-dimensional arrays. The distance or spacing between adjacent interconnects 140 and 144 (e.g., pitch) may or may not be uniform in a given direction. In some embodiments, the distance between adjacent interconnects 140 and 144 is in a range from 2 µm to 10 cm.

In FIG. 2, a dashed line 264 schematically distinguishes the first interconnects 140 from the second interconnects 144. In the present embodiment, as one non-limiting example, the conductive plane 160 (FIG. 1) is located at the lower right corner section of the second substrate 108, within the perimeter of the dashed line 264. The first interconnects 140 are those interconnects that are in direct contact with the underlying conductive plane 160. The embodiment shown in FIG. 2 includes multiple first interconnects 140, which are in signal communication with each other through the conductive plane 160. In another embodiment, however, only a single first interconnect 140 may be provided, with the circuit through the conductive plane 160 being completed by another electrically conductive component in signal communication with the conductive plane 160, such as a contact pad 152 of the first substrate 104 that contacts the conductive plane 160. The second interconnects 144 are those interconnects that pass through corresponding openings of the patterned adhesion layer 156 (FIG. 1) and are thereby electrically isolated from the conductive plane 160. The second interconnects 144 are electrically isolated from each other within the second substrate 108 as well as the conductive plane 160. However, one or more second interconnects 144 may be in signal communication with each other or the conductive plane 160 through circuitry or conductive routing provided by the first substrate 104 and/or by a device or layer (not shown) above the second substrate 108.

Figure 3:
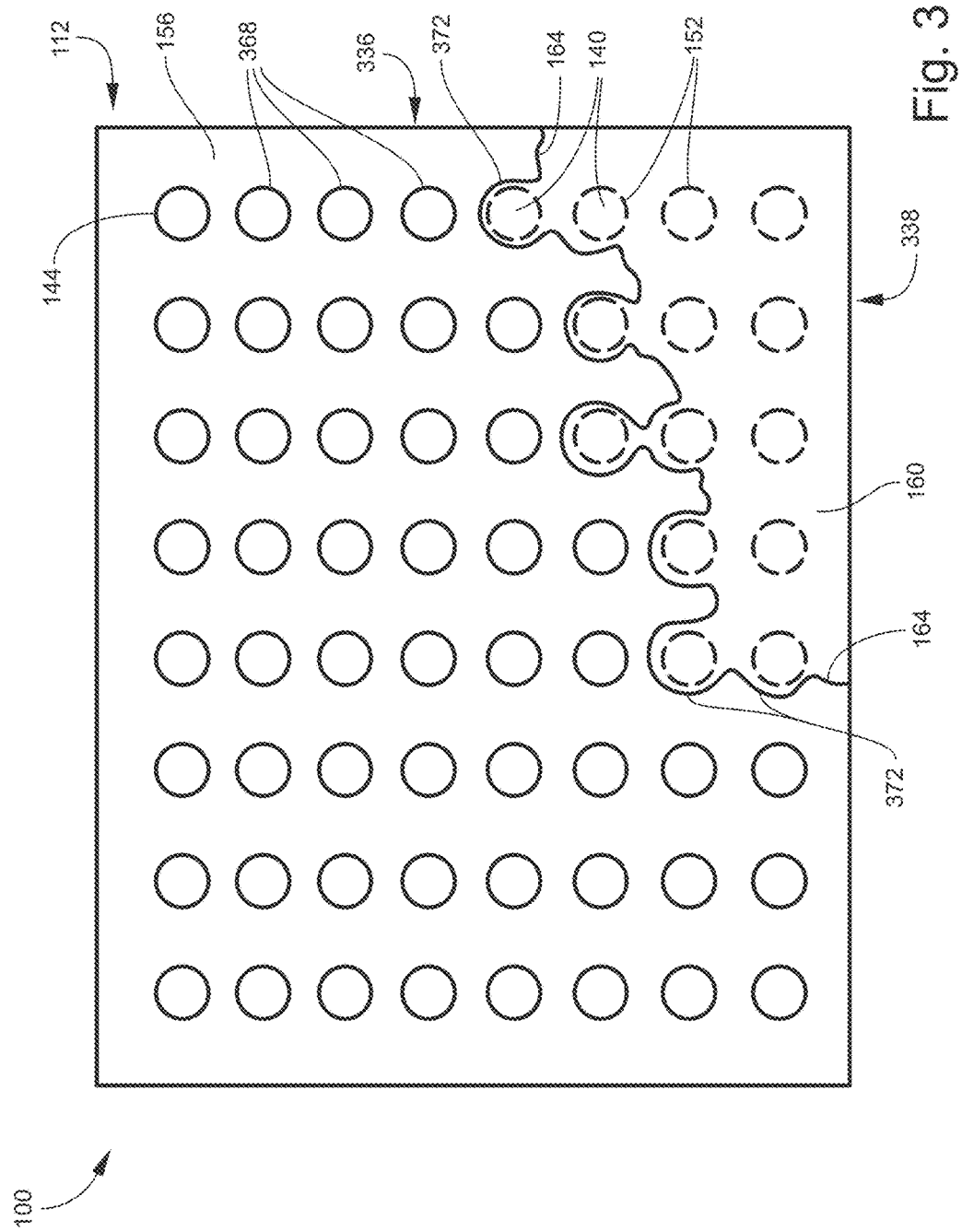
FIG. 3 is a schematic plan view of the electronic package with a substrate removed to show an intermediate region as formed on an underlying substrate.

FIG. 3 is a schematic top plan view of the electronic package 100 (a top plan view, from the perspective of FIGS. 1 and 2), with the second substrate 108 removed, thus showing the intermediate region 112 as formed on the underlying first substrate 104 (not visible). The adhesion layer 156 is patterned to provide openings 368 aligned with respective second interconnects 144 of the second substrate 108 and underlying contact pads 152 of the first substrate 104 (FIG. 1). The adhesion layer 156 also includes at least one adhesion layer edge 164 that defines the boundary between the adhesion layer 156 and the adjacent, contiguous conductive plane 160. At least a part of the edge 164 runs within the perimeter (footprint) of the first substrate 104 and the second substrate 108, thereby providing a contiguous space between the first substrate 104 and the second substrate 108 in which to form the conductive plane 160. In the illustrated embodiment, the adhesion layer edge 164 runs from one (first) outer edge 336 of the first substrate 104 and/or second substrate 108 to another (second) outer edge 338 of the first substrate 104 and/or second substrate 108 that adjoins the first outer edge 336. By this configuration, the conductive plane 160 is located in a corner section of the intermediate region 112.

In other embodiments, the adhesion layer edge 164 may extend between two opposing outer edges of the first substrate 104 and/or second substrate 108. In other embodiments, the adhesion layer edge 164 may extend to only one outer substrate edge, i.e., the adhesion layer edge 164 may begin and end at the same outer substrate edge. In some embodiments, the adhesion layer edge 164 may be an outer edge of the adhesion layer 156, as in the preceding examples and as illustrated in FIG. 3. In other embodiments the adhesion layer edge 164 may be an inner edge of the adhesion layer 156 that does not extend to any of the outer substrate edges. In this latter case, the adhesion layer edge 164 may form a closed-boundary conductive plane space completely surrounded by material of the adhesion layer 156. In this latter case, the conductive plane 160 is nonetheless distinguished from the interconnects 140 and 144 and contact pads 152 in that the conductive plane 160 occupies a larger cross-sectional area (in the transverse plane) than the areas of individual interconnects 140 and 144 and contact pads 152.

The adhesion layer edge 164 may include one or more open cavities or recesses 372 shaped to accommodate one or more first interconnects 140 located at or in proximity to the adhesion layer edge 164. Such first interconnects 140 and their corresponding first vias may be considered as being "aligned" with the corresponding recesses 372. Such first interconnects 140 may extend into the recesses 372 and contact the adhesion layer edge 164 in the recesses 372, and contact the conductive plane 160. The recesses 372 are "open" in that they are open to, and form a part of, the contiguous space occupied by the conductive plane 160. The recesses 372 hence may be contrasted with the openings or holes 368, which may be characterized as being completely defined by a closed boundary (i.e., completely surrounded by the material of the adhesion layer 156). As also shown in FIG. 3, depending on how current is to be routed through the conductive plane 160, one or more contact pads 152 may be provided on the first substrate 104 in contact the underside of the conductive plane 160. Such contact pads 152 may or may not be aligned with the first interconnects 140.

The conductive plane 160 may be considered as being a large-area, 3D conductive plane. The conductive plane 160 is three-dimensional in that it has a significant thickness, generally corresponding to the thickness of the adhesion layer 156 (such as in the thickness range given above), and/or to the distance between the first substrate 104 and the second substrate 108. In another embodiment, the conductive material may only coat the inner surfaces of the conductive plane area. The conductive plane 160 is a large-area current-carrying component in that its (average) cross-sectional area in the transverse plane is significantly larger than the (average) cross-sectional area of any of the individual interconnects 140 and 144 and contact pads 152. In some embodiments, the cross-sectional area of the conductive plane 160 is in a range from 1 $\mu m^2$ to 400 $cm^2$, and the cross-sectional area of each contact pad 152 is in a range from 0.25 $\mu m^2$ to 1000 $\mu m^2$. In some embodiments, the cross-sectional area of the conductive plane 160 is equal to or greater than the cross-sectional area occupied by any group of three adjacent contact pads 152 formed on the first substrate 104. More generally, the conductive plane 160 has a size suitable for use as a ground plane, power plane, or signal plane when integrated in an electronic package such as described herein. In addition, as described below, the conductive plane 160 may also be utilized as one of the planar electrodes of a large-area, parallel-plate capacitor integrated in an electronic package.

FIGS. 4-7 illustrate further examples of the electronic package 100 and features thereof, and examples of methods for fabricating the electronic package 100 according to some embodiments.

Figure 4:
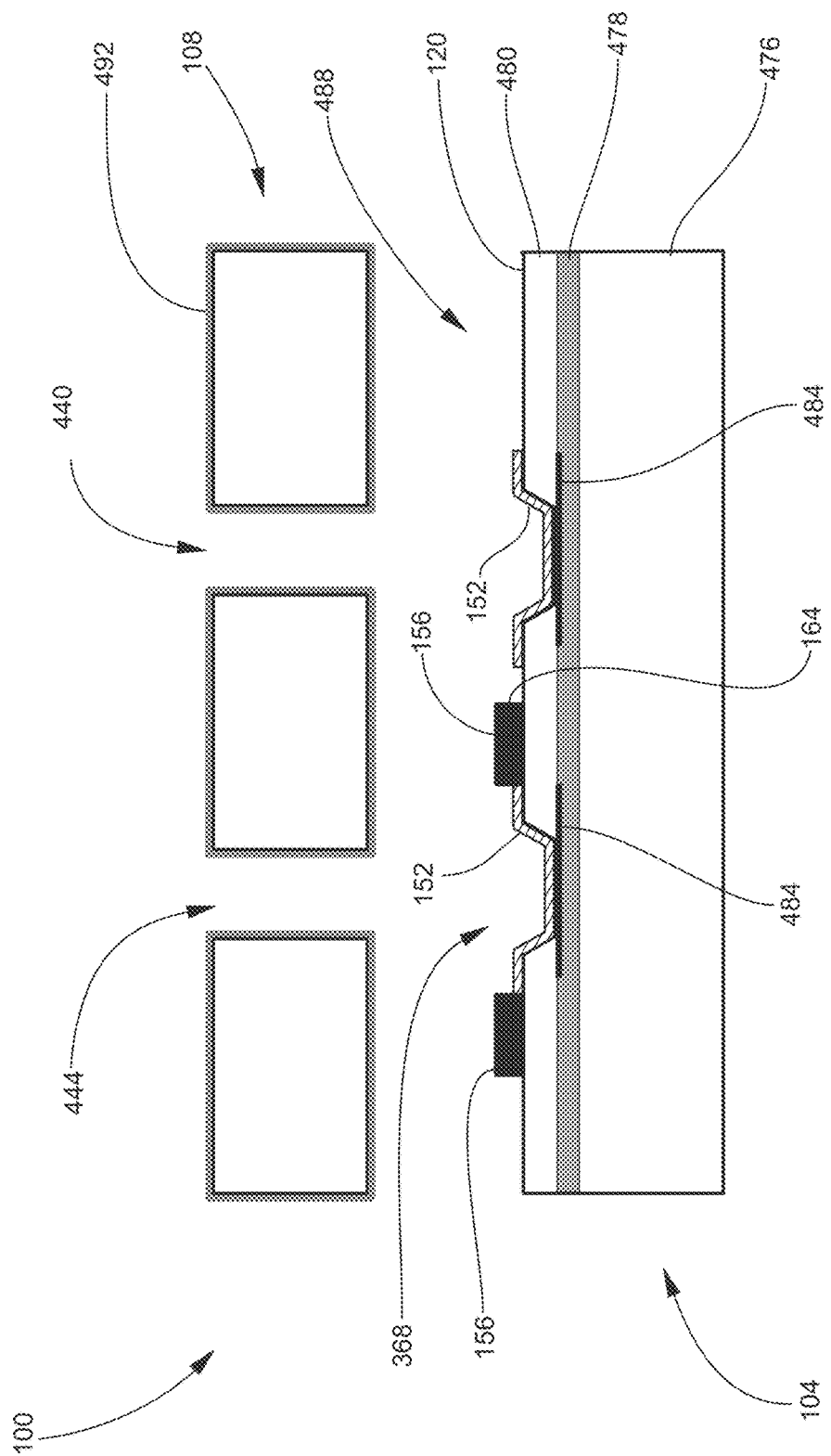
FIG. 4 is a schematic elevation view of an example of the electronic package (or part of the electronic package) prior to bonding together a first substrate and a second substrate.

FIG. 4 is a schematic elevation view of an example of the electronic package 100 (or part of the electronic package 100) prior to bonding together the first substrate 104 and the second substrate 108. In this example, the first substrate 104 includes three layers or regions: a lower layer 476, an intermediate layer 478 disposed on the lower layer 476, and an upper layer 480 disposed on the intermediate layer 478. These layers 476, 478, and 480 may be fabricated by any suitable technique now known or later developed. The dielectric and metallization configuration of the first substrate 104 represents one of any number of possible embodiments that can be appreciated by persons skilled in the art. In one embodiment, the first substrate 104 represents a bulk Si wafer with intermediate layers formed on the top (or bond) side. In another embodiment, the first substrate 104 may be a bulk Si or SOI substrate bonded face down on a handle wafer 476, and subsequently thinned to remove the majority of the bulk Si. In this latter embodiment, intermediate layer 480 represents the remaining Si of the thinned substrate. As appreciated by persons skilled in the art, the surface of any layer on which another layer is to be deposited may first be prepared as needed (e.g., cleaning/etching, dehydration by baking, etc.). In some embodiments, prior to depositing the intermediate layer 478, a metallization layer (not shown) is formed on the lower layer 476 by any suitable technique (e.g., vacuum deposition, electroplating, etc.) and then patterned by any suitable technique (e.g., photolithography) to form one or more electrical current-carrying components 484 (traces, passive or active devices, etc.) embedded in the thickness of the first substrate 104. The current-carrying components 484 may be composed of any suitable electrically conductive or semiconducting material such as noted elsewhere herein.

In some embodiments, patterned vias are then formed through the upper layer 480 to expose the current-carrying components 484. The vias may be tapered as illustrated. Depending on the composition and thickness of the upper layer 480 and the size of the vias, the vias may be formed by, for example, deep reactive ion etching (DRIE), mechanical or laser drilling, etc. As illustrated, a portion of each current-carrying component 484 may remain embedded between the upper layer 480 and the intermediate layer 478 to maintain a seal at the interfaces of the different materials. Not shown, a passivation layer may be deposited on the inside main surface 120 and patterned to expose a portion of the current-carrying component 484. A metallization layer (not shown) may be formed on the upper layer 480 by any suitable technique (e.g., vacuum deposition, electroplating, etc.) such that the metal is conformally disposed on the main inside surface 120 (which in this example is the exposed surface of the upper layer 480), the (tapered) walls defining the vias, and the exposed portions of the current-carrying components 484. Prior to depositing the metallization layer, a metal seed layer may first be deposited as appreciated by persons skilled in the art. After depositing the metallization layer, it is then patterned by any suitable technique (e.g., photolithography) to form the contact pads 152, which contact respective current-carrying components 484. If the contact pads 152 need to be isolated from the upper layer 480, then prior to depositing the metallization layer, a conformal layer of an electrically insulating material (not shown) may first be applied to the main inside surface 120, the via walls, and the exposed portions of the current-carrying components 484, and thereafter removed from the exposed portions of the current-carrying components 484 by etching or other suitable technique. In some embodiments, the additional contact pad 152 may not be required, and the current carrying elements 484 can suffice as contact pads.

The adhesion layer 156 is then formed on the first substrate 104 such that the adhesion layer 156 conformally covers the contact pads 152 and the exposed portions of the main inside surface 120. The adhesion layer 156 may be formed by any technique appropriate for its composition such as, for example, spin-coating, spray-coating, dip-coating, flow-coating, vacuum deposition (e.g., physical vapor deposition or chemical vapor deposition), evaporation, or lamination. After deposition to a desired thickness, the adhesion layer 156 is then patterned to create the openings 368 that expose respective contact pads 152 through the thickness of the adhesion layer 156, and to define a large-area conductive plane space (or area) 488 on the main inside surface 120.

The material of the adhesion layer 156 may be patterned by any technique appropriate for its composition, and thus may involve wet and/or dry etching, or micromachining (e.g., mechanical drilling, laser drilling, ultrasonic milling, etc.). As non-limiting examples, the material of the adhesion layer 156 may be patterned in accordance with techniques disclosed in above-cited U.S. Pat. No. 8,361,901 and International Publication No. WO 2014/004504. For example, prior to exposure the material may be pre-baked (or "soft-baked") at a desired temperature for a desired period of time to evaporate excess solvent from the material and partially densify and harden the material in preparation for subsequent process steps. In some embodiments, prior to patterning, the material may be deposited in more than one layers, and each layer may be pre-baked before depositing the next layer. A pattern may then be defined on the material by directing an appropriate type of exposure energy (e.g., UV light, electron beam, x-ray) through a correspondingly patterned photomask or reticle at an appropriate wavelength (e.g., 350-400 nm) and dose (mJ/cm$^2$). After exposure, the material may be subjected to a post-exposure bake (PEB) at a desired temperature for a desired period of time to increase cross-link density. After PEB, the material may be developed by applying a suitable developer chemistry to create the openings 368 through the thickness of the material and to remove a large section of the material (compared to the size of the openings 368) to define the conductive plane space 488.

After development, the resulting adhesion layer 156 may be rinsed with a solvent (e.g., isopropyl alcohol and/or water) and dried with a gas (e.g., air or nitrogen). After development, the adhesion layer 156 may be hard-baked to at least partially cure the material if desired for a particular embodiment. At least partially curing the material may be desirable to prevent reflow of the material during bonding, or otherwise to further harden the material at this stage.

In some embodiments, prior to patterning the adhesion layer 156 may be planarized if needed or desired to facilitate bonding. The adhesion layer 156 may be planarized by any technique appropriate for its composition, such as lapping or polishing. As another example, the first adhesion layer 156 may be planarized in accordance with the techniques disclosed in above-cited U.S. Pat. No. 8,361,901 and International Publication No. WO 2014/004504. In this example a flat plate, such as a glass, polyvinyl acetate (PVA) or polytetrafluorethylene (PFTE) slide, is brought into contact with the deposited adhesion layer 156 with an applied force and heated to an appropriate temperature. The force and heat may be applied, for example, by using a wafer/die bonding apparatus. The flat plate is then removed. In some embodiments, the adhesion layer 156 may then be baked at or around the glass transition temperature $T_g$ of the material to minimize or eliminate residual sites of non-planarity, by causing localized reflow of the material.

Continuing with reference to FIG. 4, one or more first vias 440 and one or more second vias 444 are formed through the entire thickness of the second substrate 108. Depending on the composition and thickness of the second substrate 108 and the size of the vias 440 and 444, the vias 440 and 444 may be formed by, for example, deep reactive ion etching (DRIE), mechanical or laser drilling, etc. The first vias 440 may be formed so as to be located in the perimeter of the conductive plane space 488 when the two substrates 104 and 108 are subsequently aligned in preparation for the bonding process. The second vias 444 may be formed in a pattern that matches the pattern of openings 368 of the adhesion layer 156 when the two substrates 104 and 108 are aligned. In some embodiments, a conformal layer 492 of an electrically insulating material may be deposited on the surfaces of the second substrate 108 to electrically isolate the second substrate 108 from the interconnect material subsequently deposited in the vias 440 and 444. Any of the insulating material noted elsewhere in this disclosure may be suitable as the insulating or passivation layer. If, however, the second substrate 108 is itself an insulating material, then the step of depositing the conformal insulating layer 492 may be omitted. In some embodiments, via formation may be considered as being a part of the method for fabricating the electronic package. In other embodiments, the second substrate 108 may be provided with pre-existing vias 440 and 444, with or without the insulating layer 492.

After forming the adhesion layer 156 and otherwise preparing the two substrates 104 and 108 as described above, the two substrates 104 and 108 are aligned manually or with an alignment tool (which may be part of the bonding apparatus). Specifically, the first vias 440 of the second substrate 108 are located above the conductive plane space 488, and may be aligned with one or more respective contact pads 152 of the first substrate 104 located below the conductive plane space 488. The second vias 444 of the second substrate 108 are aligned with respective contact pads 152 of the first substrate 104 and corresponding openings 368 of the adhesion layer 156 of the first substrate 104.

Figure 5:
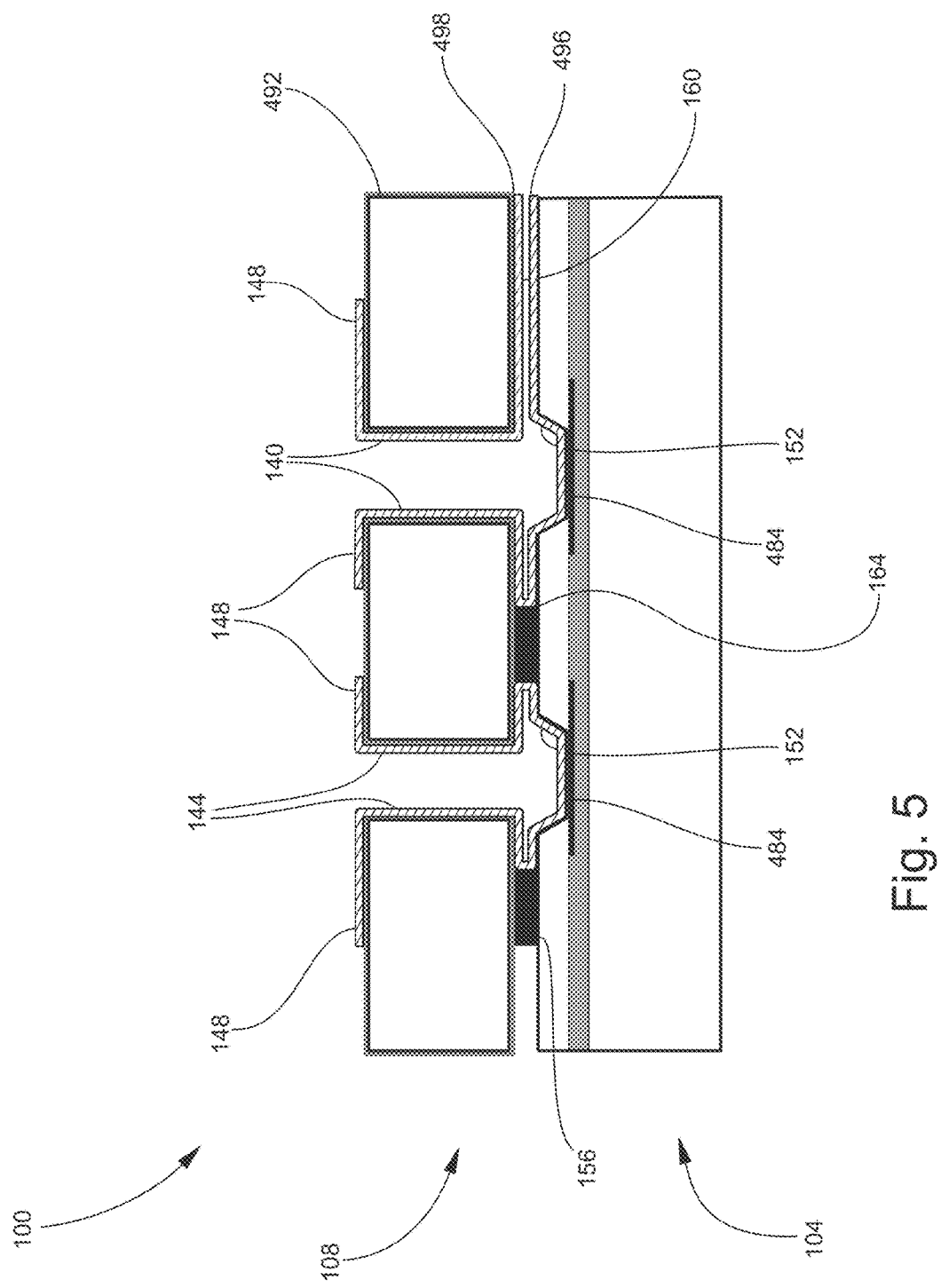
FIG. 5 is a schematic elevation view similar to FIG. 4, but after bonding together the first substrate and the second substrate.

Referring to FIG. 5, the aligned substrates 104 and 108 are then brought into contact with each other with appropriate force (pressure), temperature and time required to bond them together. For example, the force may be applied by mounting the substrates 104 and 108 in a suitable compression (e.g., thermo-compression) bonding apparatus, as appreciated by persons skilled in the art. The application of force may entail mounting the first substrate 104 in a fixed manner and forcibly moving the second substrate 108 into contact with the first substrate 104, or vice versa, or by applying a clamping force to both substrates 104 and 108 such that they bear against each other. Hence, in the present context the application of force "to" or "between" the substrates 104 and 108 encompasses any of these bonding techniques. More specifically, in the present embodiment, bringing the two substrates 104 and 108 into contact entails bringing the second substrate 108 into contact with the adhesion layer 156 formed on the underlying first substrate 104. The application of force and heat creates an effective bond between the two substrates 104 and 108 by way of the intervening adhesion layer 156.

In another embodiment, the patterned layer 156 may not function as the primary adhesion layer between 104 and 108. An unpatterned adhesion layer may be applied to the lower bond surface of the second substrate 108, and may act as the primary bond adhesion layer. This bond adhesion layer can be applied in such a manner (such as spray-coating) as to not block the vias, and not alter the overall schematic or subsequent package as shown in FIGS. 1-7. The unpatterned adhesion layer, its application, and use may be the same or similar to above-referenced International Publication No. WO 2014/004504.

Figure 6:
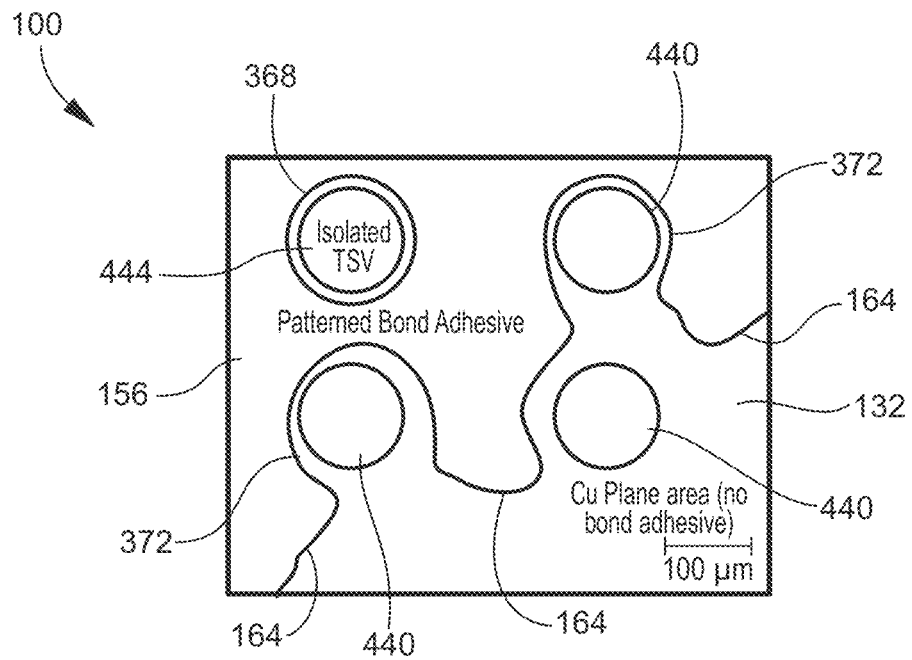
FIG. 6 is a cut-away plan view of the electronic package (or part of the electronic package) cut-away along a plane between the first substrate and the second substrate, after bonding together the first substrate and the second substrate but before forming interconnects and a conductive plane.

FIG. 6 is a cut-away plan view of the electronic package 100 (or part of the electronic package 100) shown in FIGS. 4 and 5, after bonding together the first substrate 104 and the second substrate 108 but before forming the interconnects 140 and 144 and the conductive plane 160. The view of FIG. 6 is cut away through a plane passing through the adhesion layer 156, or through the interface between the adhesion layer 156 and the first substrate 104, and faces toward the underside of the second substrate 108 (away from the first substrate 104). Exposed portions of the main inside surface 132 of the second substrate 108 (where the material of the adhesion layer 156 is absent) are visible in this view. FIG. 6 illustrates an example of how the adhesion layer 156 may be patterned to provide the openings 368 that isolate respective second vias 444 from adjacent vias 440 and 444, and the adhesion layer edge 164 that defines the location, shape, and size of the conductive plane space 488 with which the first vias 440 communicate. The adhesion layer edge 164 includes the above-described recesses 372, which partially surround respective first vias 440 that are adjacent to the adhesion layer edge 164, i.e., those first vias 440 that are nearest to the adhesion layer edge 164. As shown, the openings 368 and recesses 372 may have diameters or radii (relative to the centerline of the respective vias 440 and 444) larger than those of the vias 440 and 444. In this manner, portions of the main inside surface 132 immediately surrounding the vias 440 and 444 remain exposed to subsequent conformal deposition of interconnect/conductive plane material.

Referring back to FIG. 5, after bonding the second substrate 108 to the first substrate 104, in some embodiments a bottom-clear step (e.g., DRIE) may then be performed to remove any portion of the adhesion layer 156 or other electrically insulating material that may be present on the contact pads 152, thereby cleaning and ensuring full exposure of the contact pads 152 in preparation for 3D interconnect/conductive plane metallization in the vias 440 and 444. Subsequently, 3D metallization is performed to form the interconnects 140 and 144 and, simultaneously, the conductive plane 160. The metallization process may be capable of forming low-electrical resistance contact interfaces between the interconnects 140 and 144 and contact pads 152, and between the conductive plane 160 and contact pads 152. As a result of this metallization process, the conductive plane 160 extends transversely through the conductive plane space 488 to the adhesion layer edge 164. The conductive plane conformally contacts the portions of the respective main inside surfaces 120 and 132 of the first substrate 104 and the second substrate 108, respectively, that are exposed to the conductive plane space 488, the adhesion layer edge 164, and any contact pads 152 exposed to the conductive plane space 488. In addition, electrical connection of the interconnects 144 to the contact pads 152 does not necessarily require alignment of the pads 152 to the interconnects 144. Similarly, electrical connection of the conducting plane to the contact pads 152 does not necessarily require alignment of the pads 152 to the interconnects 140. In addition, the first interconnects 140 extend vertically through respective first vias 440 and contact the conductive plane 160 being formed simultaneously. First interconnects 140 that are adjacent to the adhesion layer edge 164 also contact the adhesion layer edge 164 and any contact pads 152 aligned with such first interconnects 140. Insofar as the interconnects 140 and 144 and the conductive plane 160 are formed by the same metallization process step, the first interconnects 140 may "contact" the conductive plane 160 by transitioning into the conductive plane 160. Moreover, the first interconnects 140, the conductive plane 160, or both the first interconnects 140 and the conductive plane 160, may be considered as being disposed on the adhesion layer edge 164. In addition, the second interconnects 144 extend vertically through respective second vias 444 and openings 368, and into contact with corresponding contact pads 152 aligned with the second interconnects 144.

The interconnect/conductive plane material may be deposited by any technique suitable for its composition and the required conformality such as, for example, PVD, CVD (e.g., metalorganic CVD (MOCVD)), electroplating, ALD, or evaporation. A seed layer composed of the same metal (e.g., copper) or more than one metal (e.g., titanium/copper) may first be deposited by sputtering or other technique. In some embodiments, the interconnect/conductive material fills the conductive plane space 488, the vias 440 and 444, and the openings 368. In other embodiments, as in the illustrated example, the interconnect/conductive material lines or coats the conductive plane space 488, the vias 440 and 444, and the openings 368, i.e., forms layers that conformally cover the surfaces defining the conductive plane space 488, the vias 440 and 444, and the openings 368. Thus, as shown in FIG. 5, the conductive plane 160 may include a (first) large-area planar section 496 disposed on the inside main surface 120 of the first substrate 104, and another (second) large-area planar section 498 disposed on the inside main surface 132 of the second substrate 108.

After forming the interconnects 140 and 144, the interconnect material on the outside main surface 128 of the second substrate 108 may be patterned as needed to form contact pads 148, conductive traces, or the like as desired to place the interconnects 140 and 144 in signal communication with circuitry of the second substrate 108 or circuitry of a device (not shown) located on or above the second substrate 108. As appreciated by persons skilled in the art, other post-bonding and finishing steps may be implemented as needed to complete the fabrication of the electronic package 100 having a desired structural and functional configuration.

Figure 7:
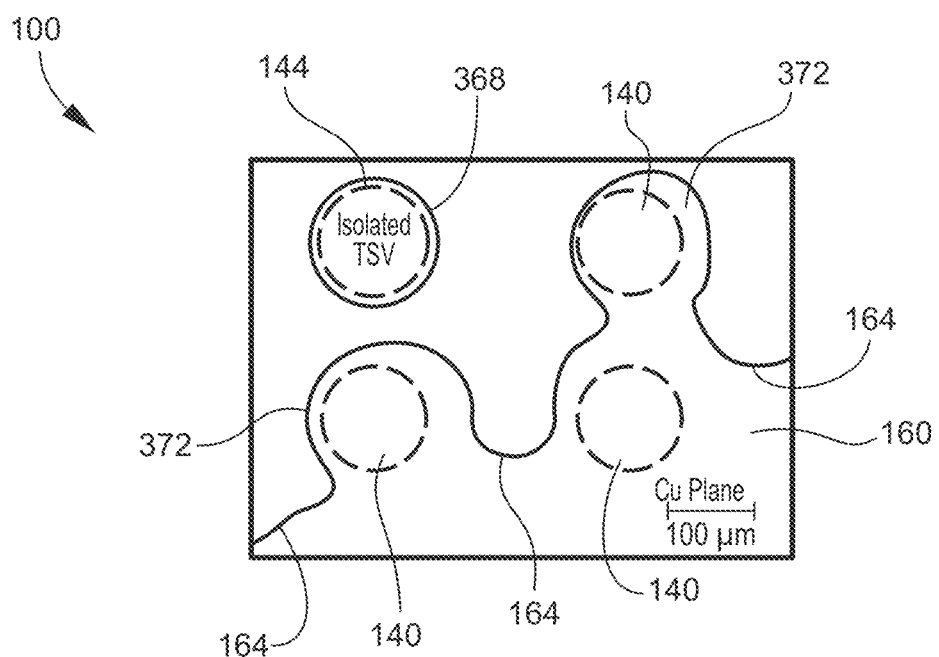
FIG. 7 is a cut-away plan view similar to FIG. 6, but after forming the interconnects and the conductive plane.

FIG. 7 is a cut-away plan view of the electronic package 100 (or part of the electronic package 100) similar to FIG. 6, but after forming the interconnects 140 and 144 and the conductive plane 160. FIG. 7 shows how the conformal metallization process forms vertically extending first interconnects 140 and the conductive plane 160, which occupies the entire extent of the conductive plane space 488 (FIG. 4) exposed to the metallization. FIG. 6 also shows how the adhesion layer 156 isolates the second interconnects 144 from the conductive plane 160 and from adjacent interconnects such as the first interconnects 140.

FIG. 8 is a schematic elevation view of an example of an electronic package 800 (or part of the electronic package 800) according to another embodiment. Certain features or components of the electronic package 800 may be the same as or similar to those of the electronic package 100 described above and illustrated in FIGS. 1 to 7, and thus are designated by the same reference numerals. In this embodiment, the electronic package 800 includes a current-carrying component formed as a large-area electrode 884 embedded in a dielectric layer 882 of the first substrate 104. As shown, the large-area electrode 884 may contact one or more contact pads 152 of the first substrate 104. The dielectric layer 882 and the large-area electrode 884 may be formed according to techniques analogous to those described above regarding formation of the intermediate layer 478, current-carrying components 484, and upper layer 480 illustrated in FIG. 4. The dielectric layer 882 may be composed of any dielectric material suitable for use as the solid dielectric slab of a capacitor. Examples include silicon dioxide and other dielectric materials noted elsewhere in the present disclosure. In this embodiment, the conductive plane 160 is disposed on the dielectric layer 882 and the large-area electrode 884 is positioned such that the conductive plane 160 and the large-area electrode 884 are generally aligned with each other on opposite sides of the dielectric layer 882, and are generally parallel with each other. The size (area) of the large-area electrode 884 may be comparable to that of the conductive plane 160. It thus can be seen that the conductive plane 160, the dielectric layer 882, and the large-area electrode 884 cooperatively form a large-area parallel-plate capacitor that is integrated in the electronic package 800.

From the foregoing, it can be seen that the subject matter disclosed herein, including the integration of large-area 3D conductive planes and capacitors, may be applied to various electronic packaging applications, such as semiconductor circuit boards, semiconductor interposers, system-in-packages (SiPs), chip stack multi-chip modules (MCMs), 3D integrated circuits (3D ICs), other 3D packages, other through-substrate interconnects (through-wafer interconnects or TWIs, through-silicon vias or TSVs), MEMS packages and heterogeneous packages composed of any combination of the above substrates/packages.

For purposes of the present disclosure, it will be understood that when a layer (or film, region, substrate, component, device, or the like) is referred to as being "on" or "over" another layer, that layer may be directly or actually on (or over) the other layer or, alternatively, intervening layers (e.g., buffer layers, transition layers, interlayers, sacrificial layers, etch-stop layers, masks, electrodes, interconnects, contacts, or the like) may also be present. A layer that is "directly on" another layer means that no intervening layer is present, unless otherwise indicated. It will also be understood that when a layer is referred to as being "on" (or "over") another layer, that layer may cover the entire surface of the other layer or only a portion of the other layer. It will be further understood that terms such as "formed on" or "disposed on" are not intended to introduce any limitations relating to particular methods of material transport, deposition, fabrication, surface treatment, or physical, chemical, or ionic bonding or interaction. The term "interposed" is interpreted in a similar manner.

It will also be understood that all ranges of values specified herein include the end values (lower values and upper values) specified, unless stated otherwise.

In general, terms such as "communicate" and "in . . . communication with" (for example, a first component "communicates with" or "is in communication with" a second component) are used herein to indicate a structural, functional, mechanical, electrical, signal, optical, magnetic, electromagnetic, ionic or fluidic relationship between two or more components or elements. As such, the fact that one component is said to communicate with a second component is not intended to exclude the possibility that additional components may be present between, and/or operatively associated or engaged with, the first and second components.

It will be understood that various aspects or details of the invention may be changed without departing from the scope of the invention. Furthermore, the foregoing description is for the purpose of illustration only, and not for the purpose of limitation—the invention being defined by the claims.

What is claimed is:

1. An electronic package, comprising:
    a first substrate;
    a plurality of electrically conductive contact pads disposed on the first substrate;
    a second substrate comprising a plurality of through-substrate first vias and a plurality of through-substrate second vias;
    a polymeric adhesion layer disposed between and bonding together the first substrate and the second substrate, the adhesion layer having a thickness between the first substrate and the second substrate, and comprising a plurality of openings through the thickness; and
    a plurality of electrically conductive first interconnects extending through respective first vias contacting a first lateral edge of the adhesion layer at a gap between the first substrate and the second substrate, disposed against and extending along an underside of the second substrate, and contacting respective contact pads.

2. The electronic package of claim 1, further comprising an electrically conductive plane extending across a space between the first substrate and the second substrate and contacting a second lateral edge of the adhesion layer at the gap between the first substrate and the second substrate.

3. The electronic package of claim 2, further comprising a plurality of electrically conductive second interconnects extending through respective second vias, and contacting the conductive plane.

4. The electronic package of claim 1, wherein at least one of the first substrate and the second substrate comprises a semiconductor material.

5. The electronic package of claim 2, wherein at least one of the first interconnects extends along a sidewall of the first vias.

6. The electronic package of claim 5, wherein at least one of the first interconnects connects to the electrically conductive plane in an undercut region of the second substrate.

7. The electronic package of claim 6, wherein the undercut region includes therein the first lateral edge of the adhesion layer.

8. The electronic package of claim 1, wherein the polymeric adhesion layer comprises a composition selected from the group consisting of photoresist, epoxy-based photoresist, polyimide, polyparaxylylene, liquid crystal polymer, benzocyclobutene, and SU8.

9. The electronic package of claim 1, wherein the thickness of the adhesion layer is in a range from 1 to 100 µm.

10. The electronic package of claim 2, wherein the conductive plane comprises copper.

11. The electronic package of claim 10, wherein one of the first interconnects is aligned with one of the contact pads.

12. The electronic package of claim 1, wherein the lateral edge of the adhesion layer is offset from at least one of the first vias.

13. The electronic package of claim 1, further comprising an electrically conductive plane extending across a space between the first substrate and the second substrate, contacting a second lateral edge of the adhesion layer at the gap between the first substrate and the second substrate, and extending to an outer perimeter of at least one of the first substrate and the second substrate.

14. The electronic package of claim 13, further comprising a plurality of electrically conductive second interconnects extending through respective second vias, and contacting the conductive plane.

15. The electronic package of claim 14, wherein at least one of the second interconnects and the conductive plane are connected together along a meandering path crossing the gap between the first and second substrates, disposed at least on the second lateral edge of the adhesion layer, and disposed on an underside of the second substrate.

16. The electronic package of claim 1, wherein at least one of the first interconnects and at least one of the contact pads are connected together along a meandering path crossing the gap between the first and second substrates, disposed at least on the first lateral edge of the adhesion layer, and disposed on an underside of the second substrate.

17. The electronic package of claim 1, further comprising an insulator formed on the first substrate.

18. The electronic package of claim 17, wherein the contact pad is disposed on the insulator and extends to a periphery of the first substrate.

19. The electronic package of claim 1, wherein the second substrate comprises a different material than the first substrate.

20. An electronic package, comprising:
a first substrate;
a plurality of electrically conductive contact pads disposed on the first substrate;
a second substrate comprising a plurality of through-substrate first vias and a plurality of through-substrate second vias;
a polymeric adhesion layer disposed between and bonding together the first substrate and the second substrate, the adhesion layer having a thickness between the first substrate and the second substrate, and comprising a plurality of openings through the thickness; and
a plurality of electrically conductive first interconnects extending through respective first vias contacting a first lateral edge of the adhesion layer at a gap between the first substrate and the second substrate, disposed on an underside of the second substrate, and contacting respective contact pads; and
an electrically conductive plane extending across a space between the first substrate and the second substrate and contacting a second lateral edge of the adhesion layer at the gap between the first substrate and the second substrate.

* * * * *